United States Patent [19]
Beyerlein

[11] 3,905,038
[45] Sept. 9, 1975

[54] SEMICONDUCTOR ASSEMBLY AND METHOD

[75] Inventor: Fritz W. Beyerlein, Sunnyvale, Calif.

[73] Assignee: Signetics Corporation, Sunnyvale, Calif.

[22] Filed: Feb. 26, 1973

[21] Appl. No.: 335,542

[52] U.S. Cl. ........................ 357/70; 357/69; 357/72; 357/81

[51] Int. Cl.[2] ........................ H01L 29/52

[58] Field of Search ........................ 317/234, 101

[56] References Cited

UNITED STATES PATENTS

| | | | |
|---|---|---|---|
| 3,544,857 | 12/1970 | Byrne et al. | 317/234 |
| 3,573,574 | 4/1971 | Davis | 317/234 |
| 3,665,256 | 5/1972 | Goun et al. | 317/101 |

*Primary Examiner*—Michael J. Lynch
*Assistant Examiner*—E. Wojciechowicz
*Attorney, Agent, or Firm*—Flehr, Hohbach, Test, Albritton & Herbert

[57] ABSTRACT

Semiconductor assembly and method in which very small pill-like packages can be mounted directly on boards and can be directly mounted in assemblies and stacks. The pill-like package encapsulates a semiconductor body having at least a portion of an electrical circuit formed therein with contact pads in a predetermined pattern carried by the body and lying in a common plane with a plurality of first leads bonded to the contact pads and the first leads extending outwardly from the semiconductor body and having outer extremities which lie in a predetermined pattern with encapsulating means encapsulating the semiconductor body and the portions of the first leads in engagement with the contact pads. The pill-like package is very small and has a spider-like conformation. The leads are formed in such a manner so that the packages can be directly mounted upon printed circuit boards without extending the leads through holes. The pill-like packages can be stacked into assemblies in which the leads are interconnected.

21 Claims, 16 Drawing Figures

SEMICONDUCTOR ASSEMBLY AND METHOD

BACKGROUND OF THE INVENTION

In copending application Ser. No. 293,929, filed Oct. 2, 1972, there is disclosed a pill-like package construction which is utilized for mounting semiconductor chips. In the semiconductor industry, there is a need for low cost means for mounting the pill-like packages and particularly for such mounting means which lends itself to automated production. There is, therefore, a need for a new and improved semiconductor assembly and method for fabricating the same.

SUMMARY OF THE INVENTION AND OBJECTS

The semiconductor assembly consists of a package and means for mounting the package. The package comprises a semiconductor body having at least a portion of an electrical circuit formed therein with contact pads in a predetermined pattern carried by the body and lying in a common plane. A plurality of first leads are bonded to the contact pads. The first leads extend outwardly from the semiconductor body and have outer extremities which lie in a predetermined pattern. First encapsulating means encapsulates the semiconductor body and the portions of the first leads in engagement with the contact pads whereby the outer extremities of the first leads are free of the first encapsulating means. The mounting means is formed in such a manner so that the packages are connected directly into the circuitry with which they are to be incorporated. This mounting means can take the form of substrates or boards having planar surfaces upon which the packages are mounted. Alternatively, the mounting means can be in a form so that the packages can be stacked one above the other.

In general, it is an object of the present invention to provide a semiconductor assembly and method which permits very small packages to be incorporated directly into the circuitry in which they are to be utilized without further encapsulation.

Another object of the invention is to provide an assembly and method of the above character in which the packages can be mounted on printed circuit boards, ceramic boards and the like.

Another object of the invention is to provide a semiconductor assembly and method of the above character in which the packages are stacked one above the other for interconnections on a stack.

Additional objects and features of the invention will appear from the following description in which the preferred embodiments are set forth in detail in conjunction with the accompanying drawings.

BRIEF DESCRIPTION OF THE PREFERRED EMBODIMENTS

Figure 2A:
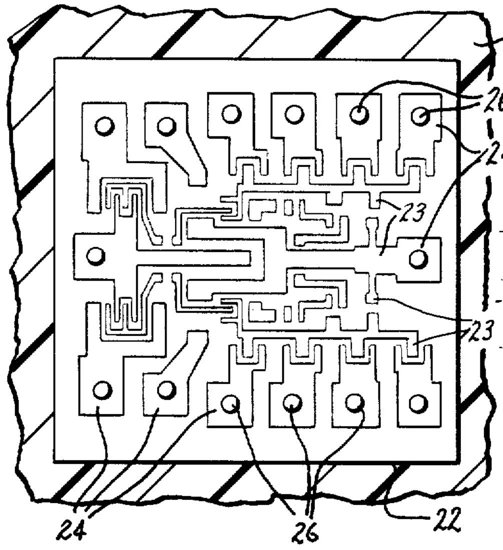
FIG. 2*a* is a cross-sectional view taken along the line 2*a* —2*a* of FIG. 1.

A pill-like package 21 having a spider-like configuration which is utilized in the semiconductor assembly comprising the present invention is described in copending application Ser. No. 293,929, filed Oct. 2, 1972. As described therein, the pill-like package 21 consists of a semi-conductor body or chip 22 formed of a suitable semiconductor material such as silicon. The semiconductor body is provided with diffused PN junctions which extend to the surface which form active and passive devices such as transistors and resistors that are interconnected by appropriate metallization 23 adherent to the planar surface of the chip 22 to form at least a part of an electrical circuit and which is conventionally called an integrated circuit. The metallization 23 includes contact pads 24 carried by a planar surface of the semiconductor body and lying in a common plane. The contact pads 24 are arranged in a predetermined pattern adjacent the outer perimeter of the semiconductor body. Bumps 26 are formed on the contact pads. A plurality of first leads 27 are bonded to the bumps 26 secured to the contact pads by suitable means such as a reflow solder technique. As described in said copending application Ser. No. 293,929, filed Oct. 2, 1972, the first leads 27 can form part of arrays formed in a sheet of conducting material. The first leads 27 extend outwardly from the semiconductor body and have outer extremities which lie in a predetermined pattern. Portions of the first leads 27 adjacent the inner extremity of the same are provided with convolutions 28. First encapsulating means 31 formed of a suitable material such as plastic encapsulates the semiconductor body 22, the inner extremities of the first leads 27 in engagement with the contact pads to form a pill-like package. The outer extremities of the first leads are free of the first encapsulating means.

As explained in copending application Ser. No. 293,929, filed Oct. 2, 1972, the arrays of which the leads 27 form a part can be provided with blind support tabs 32 that are utilized for supporting the pill-like package when the first leads 27 are severed from the sheet from which they are formed to permit testing of the pill-like package while still being carried by the blind support tabs. The inner extremities of the blind support tabs 32 are positioned so that they are encapsulated by the first encapsulating means but are spaced outwardly from the inner extremities of the first leads. During the time that the pill-like packages are being fabricated, the leads 27 are trimmed and they are tested and symbolized.

A pill-like package incorporating the present invention can be of relatively small size. For example, the first encapsulating means 31 can have a diameter ranging from 0.040 inches to 1.00 inches. With the leads, the packages can have a dimension ranging from 0.080 inches to 1.50 inches.

In semiconductor assemblies incorporating the present invention, means is provided for directly mounting the pill-like packages so that they are directly connected into the circuitry. When the mounting means takes the form of a board-like substrate such as a PC board, the leads 27 are bent to assume a dog-like shape such as that shown in FIGS. 4, 6 and 8. As shown therein, the outer extremities of the leads 27 are bent so they are provided with downwardly and outwardly inclined portions 27*a* which extend down below the lower surface of the body 31 formed by the first encapsulating means as, for example, by 5–10 mils. Each of the leads is also provided with an outwardly extending portion 27*b* so that each of the same lie in a common plane which is generally parallel with the lower surface of the encapsulating body 31. The outer extremities of the leads 27 are tin-plated to facilitate mounting of the pill-like packages.

Figure 3:
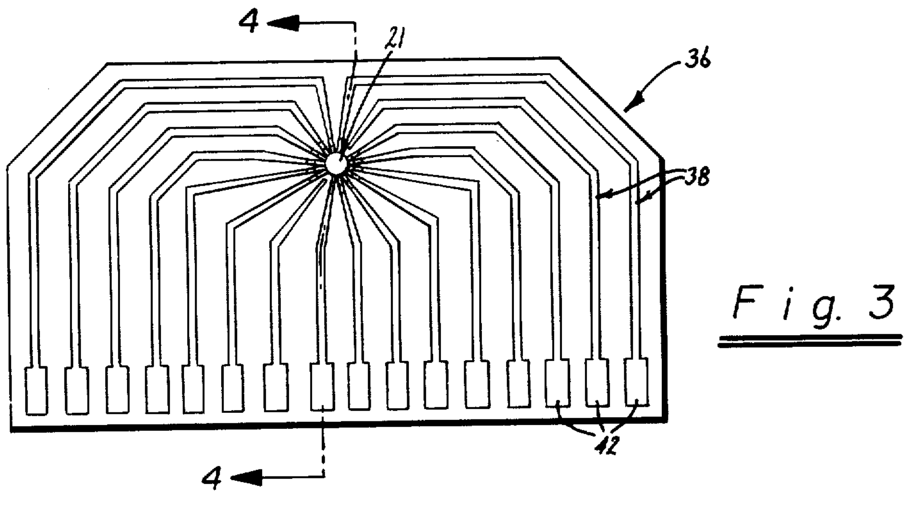
FIG. 3 is a top plan view of a semiconductor assembly incorporating the present invention utilizing a package of the type shown in FIGS. 1 and 2 mounted upon a printed circuit board formed of an epoxy reinforced with fiberglass.
Figure 4:
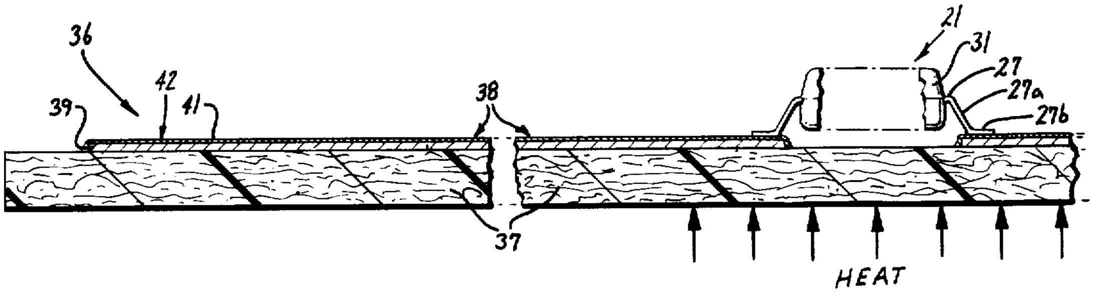
FIG. 4 is a cross-sectional view taken along the line 4—4 of FIG. 3.

As shown in FIGS. 3 and 4, the pill-like package 21 can be directly mounted upon a printed circuit board 36 of a conventional construction. As is well known to those skilled in the art, such a printed circuit board can be formed partially or entirely of a suitable insulating material 37 such as a plastic sheet formed of an epoxy reinforced with fiberglass. Such a sheet is provided with a planar surface 37 on which there is formed a pattern of second leads 38. The leads 38 can be formed in a suitable manner such as by plating a layer of copper 39 onto the surface 37, removing the undesired copper and then plating a layer of tin 41 onto the remaining copper to form the leads 38. As shown in FIG. 3, the leads 38 converge inwardly so that their inner extremities lie in any desired predetermined pattern as, for example, a circular pattern, which corresponds to the pattern of the outer extremities of the leads 27 of the pill-like package 21. The outer extremities of the leads 38 extend into contact pads 42 provided along one side of the board 36 so that, if desired, the board can be utilized as a plug-in board.

When it is desired to mount one or more pill-like packages 21 on the printed circuit board 36 of the type hereinbefore described, the printed circuit board can be placed on a hot plate having a suitable temperature such as 200°C. to provide localized heating. The pill-like package 21 can then be placed over the inner extremities of the leads 38 so that the portion 27*b* of the leads 27 are in registration with the inner extremities of the leads 38. The tin on the leads 27 and on the leads 38 will reflow at this temperature to cause the outer extremities of the leads 27 to be soldered to the inner extremities of the leads 38. The printed circuit board 36 can then be removed from the hot plate to permit the solder to solidify to form the necessary bond between the pill-like package 21 and the printed circuit board. Thus, it can be seen that even though the pill-like package is very small, it can be directly mounted upon the printed circuit board without difficulty and by hand if so desired. Alternatively, a solder cream can be used as an adhesive to secure the leads 27 of the packages 21 to the leads 38. The packages 21, while secured to the leads, can then be passed through a belt furnace to permit the solder to reflow to form permanent bonds between the leads 27 and the leads 38.

In view of the face that each of the pill-like packages 21 are provided with a great many leads, it is very desirable that all of the leads 27 contact the inner extremities of the leads 38. This is made possible by the outwardly inclined dog-shaped leads 27. Since there is clearance between the lower surface of the encapsulating body 31 and the PC board, it is possible to press downwardly upon the body 31 to spring-load all the dog-shaped legs 27 into engagement with the inner extremities of the leads 38 so that all the leads 27 will be soldered to the leads 38. Thus, in effect, the pill-like package 21 is self-levelling because of the springy leads which are provided.

As an alternate to the hand method hereinbefore described in conjunction with the printed circuit board shown in FIGS. 3 and 4, a pattern of second leads can be formed on a printed circuit board by silk screening the leads onto the board. The pill-like package 21 can then be positioned over the inner extremities of the leads and a suitable organic adhesive can be utilized for holding the package in place. The printed circuit card can then be run through a furnace to burn out the adhesive and to reflow the solder to form bonds between the leads 27 of the pill-like package and the silk screen pattern.

Figure 5:
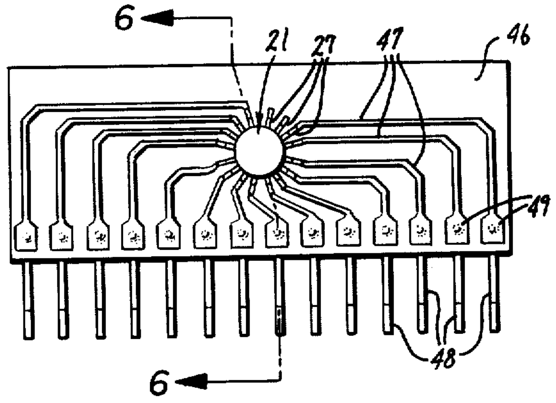
FIG. 5 is a plan view of another embodiment of a semiconductor assembly incorporating the present invention utilizing a ceramic board.
Figure 6:
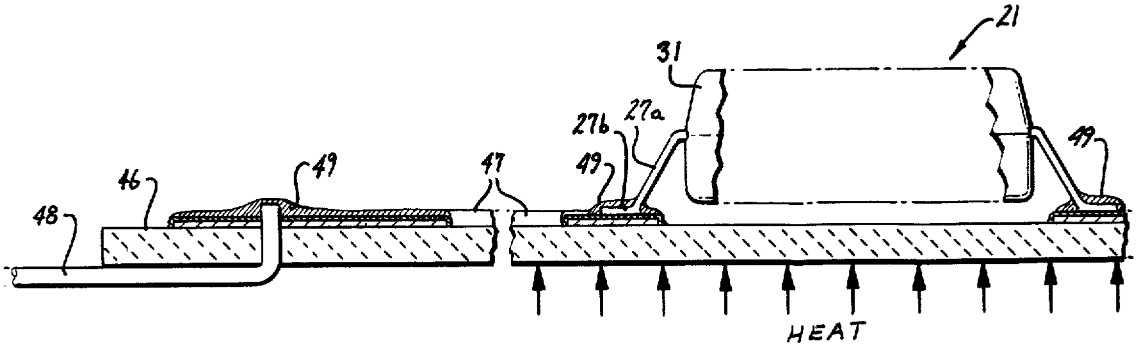
FIG. 6 is a cross-sectional view taken along the line 6—6 of FIG. 5.

In FIGS. 5 and 6 there is shown another embodiment of the semiconductor assembly incorporating the present invention in which the board 46 is formed of a ceramic. Such a board is utilized when closer tolerances are required than that which can be obtained with an epoxy board. Localized heating is utilized for the ceramic board to prevent warping of the ceramic board as shown in FIG. 4. A pattern of leads 47 is again formed on the upper surface of the board 46 as shown in FIGS. 5 and 6. Conducting terminals 48 are carried by the board 46 and extend upwardly through the board and are secured to the outer extremities of the leads 47 by suitable means such as solder 49. A pill-like package 21 is then positioned so that the outer extremities of its dog-shaped leads 27 overlie the inner extremities of the leads 47 as shown in FIGS. 5 and 6. Since the entire card or board 46 is made of a ceramic, the entire card can be heated if desired to cause reflow of the solder provided on the leads 27 and on the leads 47 to form a bond between the outer extremities of the leads 27 and the inner extremities of the leads 47.

Figure 7:
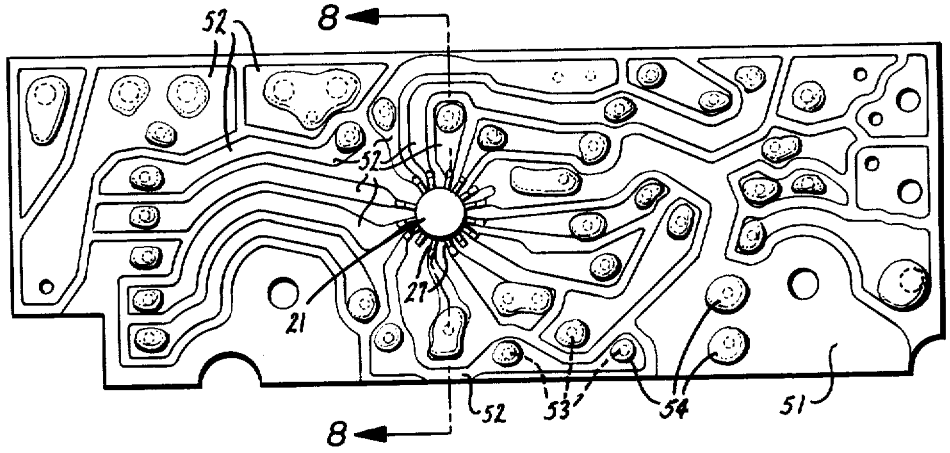
FIG. 7 is a top plan view of another embodiment of a semiconductor assembly incorporating the present invention utilizing a phenolic board.
Figure 8:
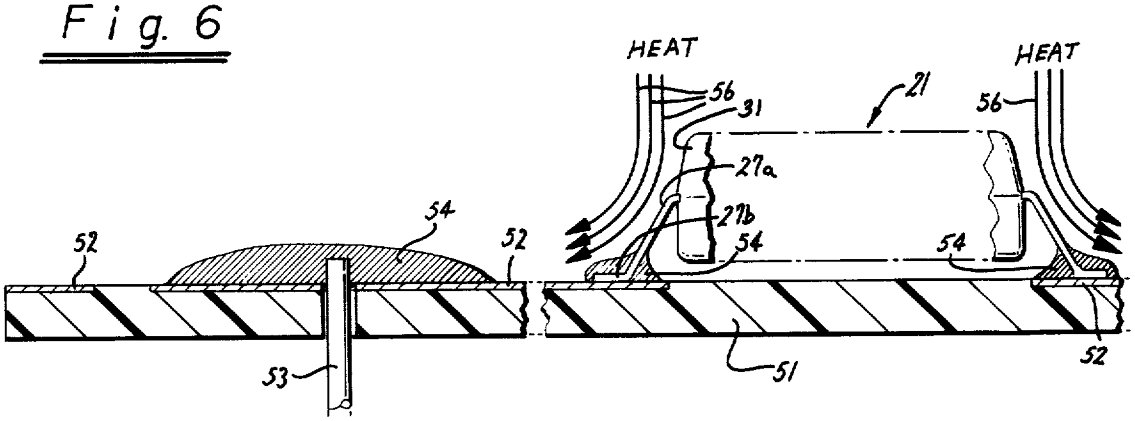
FIG. 8 is a cross-sectional view taken along the line 8—8 of FIG. 7.

Another semiconductor assembly incorporating the present invention is shown in FIGS. 7 and 8 in which a board 51 formed of a suitable insulating material such as a phenolic is utilized. A pattern of leads 52 is formed on one surface of the board as shown in FIGS. 7 and 8. Terminals 53 extend through the board and make contact to the outer extremities of the leads 58 and are secured thereto by solder 54. A pill-like package 21 is then positioned over the inner extremities of the leads 52 so that its leads are in registration with the leads 52. Thereafter, localized heating may be applied by the use of a forming gas torch as indicated by the arrows 56 to apply heat to the leads to cause reflow of the solder and to cause bonds to be formed between the outer extremities of the leads 27 and the inner extremities of the leads 52.

Figure 9:
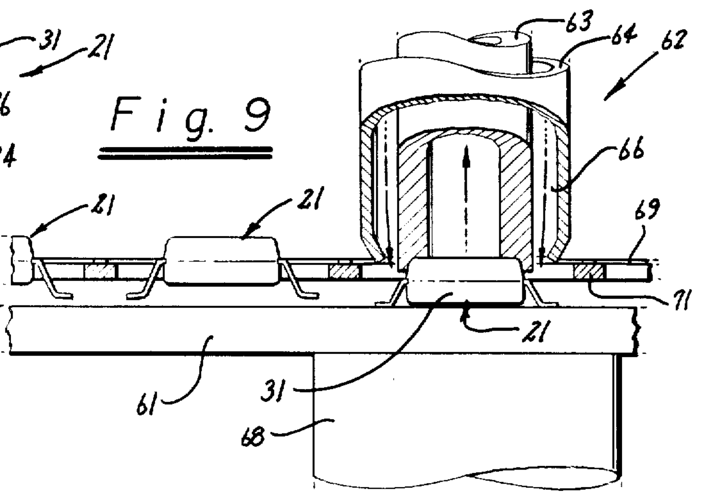
FIG. 9 is a side elevational view partly in cross-section showing the method utilized in forming the semiconductor assembly shown in FIGS. 7 and 8.
Figure 2:
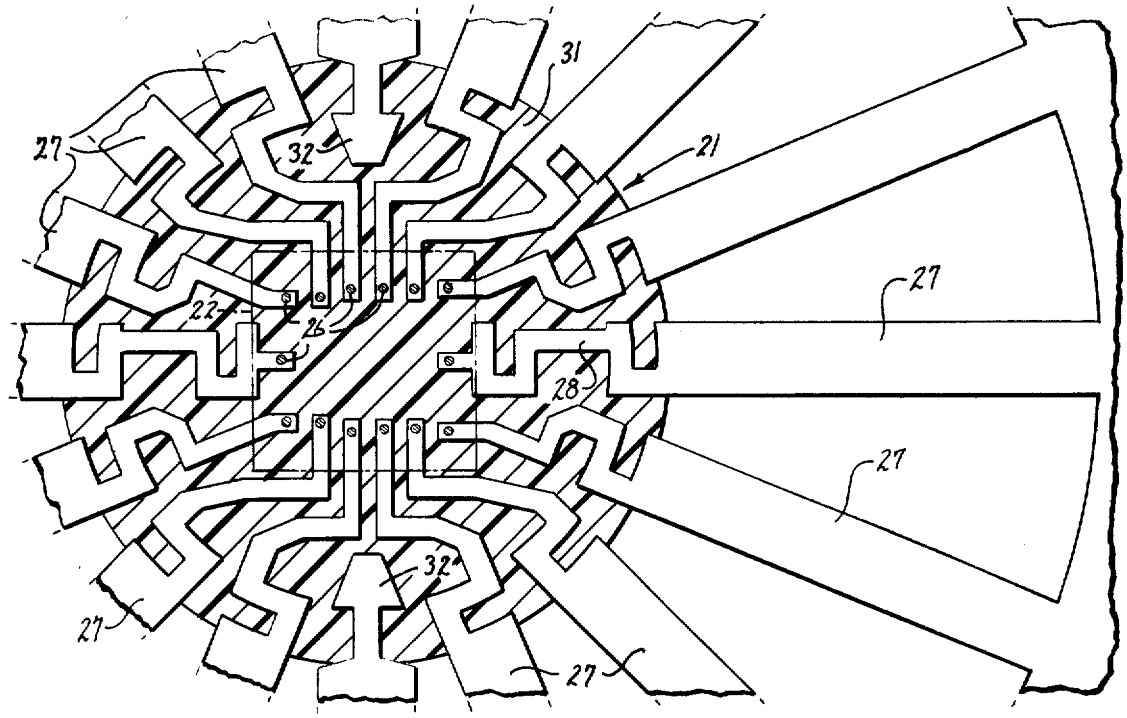
FIG. 2 is a cross-sectional view taken along the line 2—2 of FIG. 1.
Figure 1:
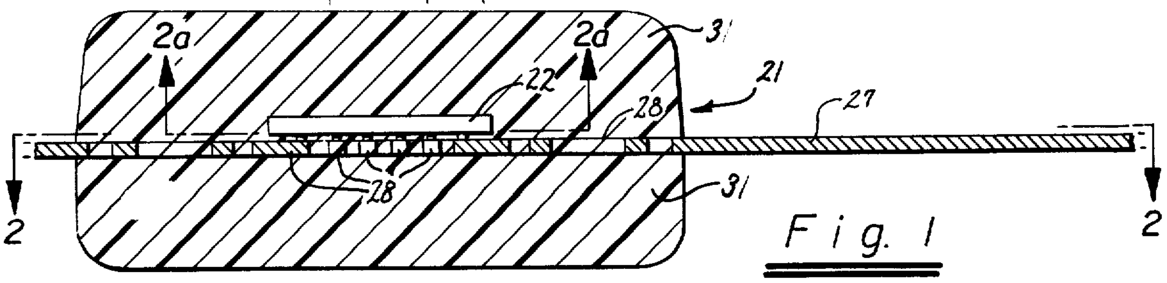
FIG. 1 is a cross-sectional view of a pill-like package utilized in the present invention.

An automated approach for securing pill-like packages 21 to a lead carrying substrate 61 is shown in FIG. 9. As shown therein, a combination probe 62 is provided. This combination probe includes an inner vacuum probe 63 which is sized so that it is adapted to engage the encapsulating body 31 as shown in FIG. 9. The combination probe also includes an outer cylindrical tube 64 which is coaxial with the tube 63 to provide a cylindrical passage 66 for heating and cooling gases. The hot forming gas creates localized heating to cause reflow of the solder on the ends of the legs 27 and the solder carried by the leads to which the pill-like package is to be bonded. After the solder has been reflowed, the forming gas can be turned off and a cold inert gas can be introduced through the passage 66 to cool the solder.

When such a combination torch is incorporated in automatic equipment, it can be seen that the pill-like packages can be automatically mounted on printed circuit boards. Thus, there is shown preheating means 68 which is utilized for preheating the substrate or printed circuit board 61. The pill-like packages can be carried by a frame 69 of the type described in copending application Ser. No. 293,929, filed Oct. 2, 1972. The frame can be carried on an automatically controlled stepping table which includes a stripper plate 71 so that successive pill-like packages can be stepped so that they underlie the combination probe 62. The pill-like packages can be stripped from the frame and positioned on the printed circuit board 61 which also can be positioned automatically by an automatically positioned stage whereby the pill-like packages can be automatically positioned and secured to the substrate 61 in the desired positions with the leads of the pill-like packages being bonded to the leads carried by the substrate 61.

Figure 11:
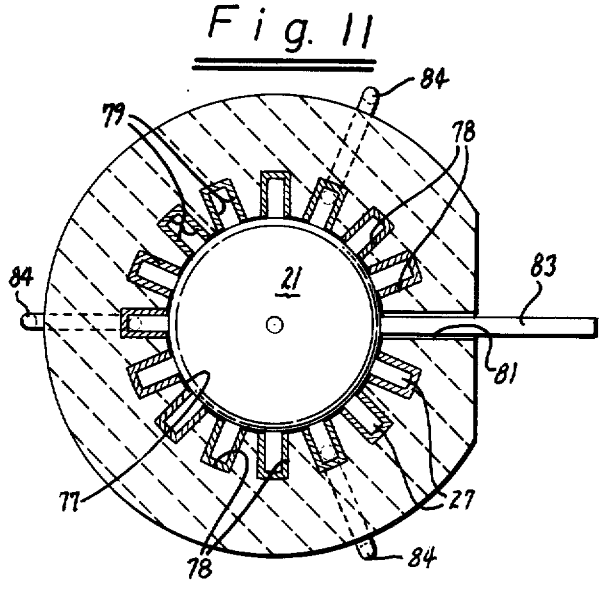
FIG. 11 is a cross-sectional view taken along the line 11—11 of FIG. 10.
Figures 10, 12:
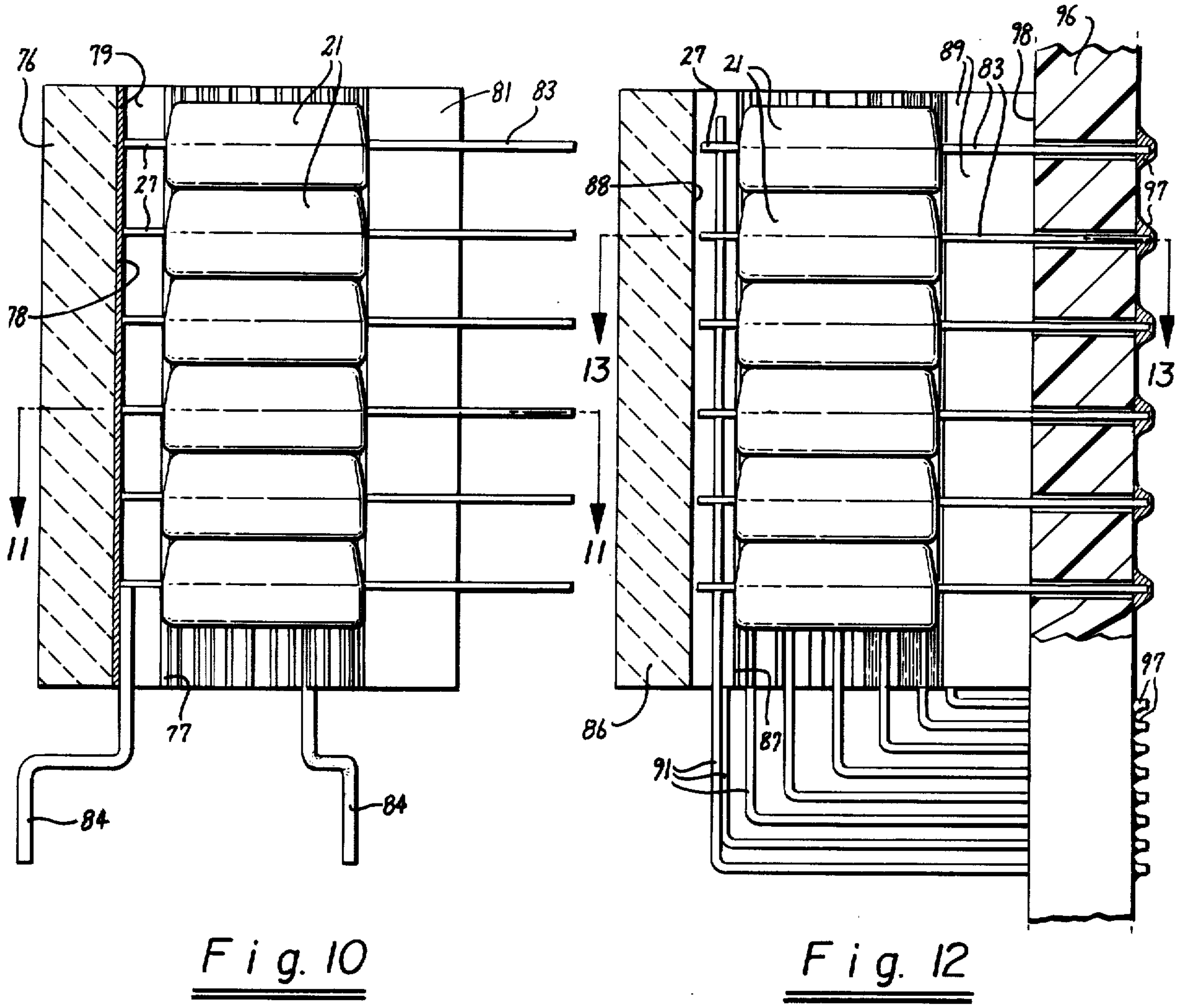
FIG. 10 is a cross-sectional view of a semiconductor assembly incorporating the present invention showing the packages stacked one above the other and interconnected.
FIG. 12 is a cross-sectional view of still another embodiment of a semiconductor assembly incorporating the present invention also showing packages stacked one above the other interconnected.

In FIGS. 10–13 mounting means of a different type is shown for the pill-like packages. As shown therein, the mounting means takes a form in which the pill-like packages 21 can be stacked one above the other. Thus, as shown in FIGs. 10 and 11 the mounting means takes the form of an elongate spaghetti-like tube 76 formed of a suitable heat conducting material such as aluminum oxide or beryllium oxide. The tube 76 is provided with an inner bore 77 extending longitudinally through the same. Generally rectangularly-shaped slots 78 are formed in the tube 76 and extend longitudinally of the tube. The slots 78 are open on one side and open into the central bore 77. The slots are formed in a predetermined pattern which corresponds to the pattern of the outer extremities of the leads 27 of the pill-like packages 21. Thus, the slots 78 are spaced generally circumferentially around the bore 77 and are generally equally spaced. The surface of the tube 76 which forms the slots 78 is provided with a layer 79 of conducting metal. By way of example, this can be accomplished by metallizing the exposed surfaces of the bore 77 and the slots 78 and then utilizing a reamer to remove the metal from the bore 77 so that the layer of metal 79 only remains in the slots 78. It is preferable that this layer of metal 79 which is provided in the slots also be solder plated to facilitate forming bonds with the solder coated leads of the pill-like packages. In the event that the assembly which is formed in FIGS. 10 and 11 is to be utilized for a memory package, the tube 76 is provided with a radially extending slot 81 which opens into the bore 77 and which extends through the tube and also extends longitudinally of the tube.

When such a construction is utilized, a pill-like package 21, in addition to having the leads 27, is provided with an additional or chip enable lead 83. The pill-like packages 21 can be inserted manually or by automatic equipment into the tube 76 with the chip enable lead 83 being positioned in the slot 81 and with the leads 27 being positioned in the slots 78. The pill-like packages are inserted into the tube 76, one above the other, until the tube is filled as shown in FIG. 10. The entire assembly can then be immersed in a suitable heated solution to cause reflow of the solder on the leads 27 and the solder within the sb ts 78 to form bonds between the same. One heated solution found to be suitable is heated peanut oil. Input-output leads 84 are then brazed into the slots 78 and extend downwardly from the tube.

With the construction shown in FIGS. 10 and 11, it can be seen that the input-output leads 84 are each in contact with the corresponding leads of the pill-like packages 21. Thus, all the power lines, the decoding lines as well as the chip enable lines are all readily accessible. With this construction, it can be seen that in relatively small packages it is possible to provide a relatively large memory as, for example, 4,096 bits of memory in a stack approximately 60 mils in height. With a hundred pill-like packages mounted in the tube, it would be necessary to provide a tube approximately 6 inches in height which would provide 400,000 bits of memory.

Figure 13:
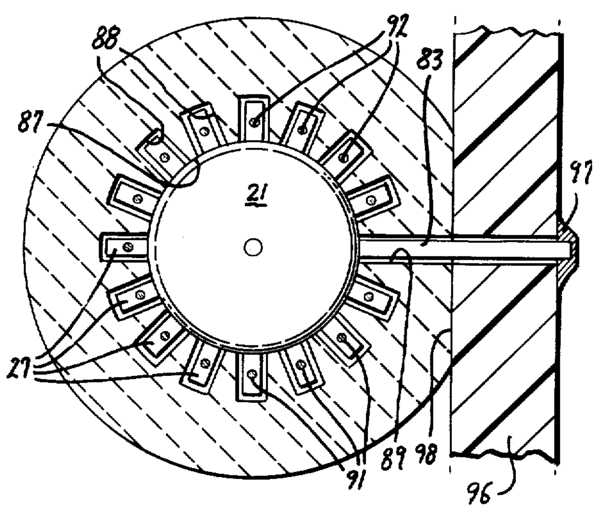
FIG. 13 is a cross-sectional view taken along the line 13—13 of FIG. 12.

Another embodiment of the same type of assembly is shown in FIGS. 12 and 13. In this embodiment, a tube 86 is also provided similar to the tube 76 and it is provided with a central bore 87 and radially extending slots 88 which open into the bore 87. As shown, the slots 88 are also generally equally spaced around the outer perimeter of the bore. The tube is provided with a longitudinally extending slot 89 which extends into the bore and out through one side. In this embodiment, the slots 88 are not provided with a metallized surface. Rather, the leads 27 of the pill-like packages are interconnected by means of longitudinally extending wires or conductors 91 which extend upwardly through holes 92 provided in the leads 27 of the pill-like package. The conductors 91 can be coated with tin. As can be seen, the pill-like packages can be stacked in the same manner as in the previous embodiment with the conductors 91 forming the connections between the corresponding leads of the pill-like packages rather than the metallization in the slots. This assembly can again be immersed in a suitable solution such as peanut oil to cause reflowing of the solder and to cause good bonds to be formed between the conductors 91 and the leads 27.

The mounting means which is shown in FIGS. 10–12 is of a type which can be readily mounted upon PC boards and the like. Thus, as shown in FIGS. 12 and 13, the mounting means is mounted upon a PC board 96 by having the chip enable leads 83 and the input-output leads 91 extending through the board and being connected to a lead pattern carried by the board by means of solder 97. The tube 86 is provided with a flat 98 to facilitate mounting on a printed circuit board as shown in FIGS. 12 and 13.

Figures 14, 15:
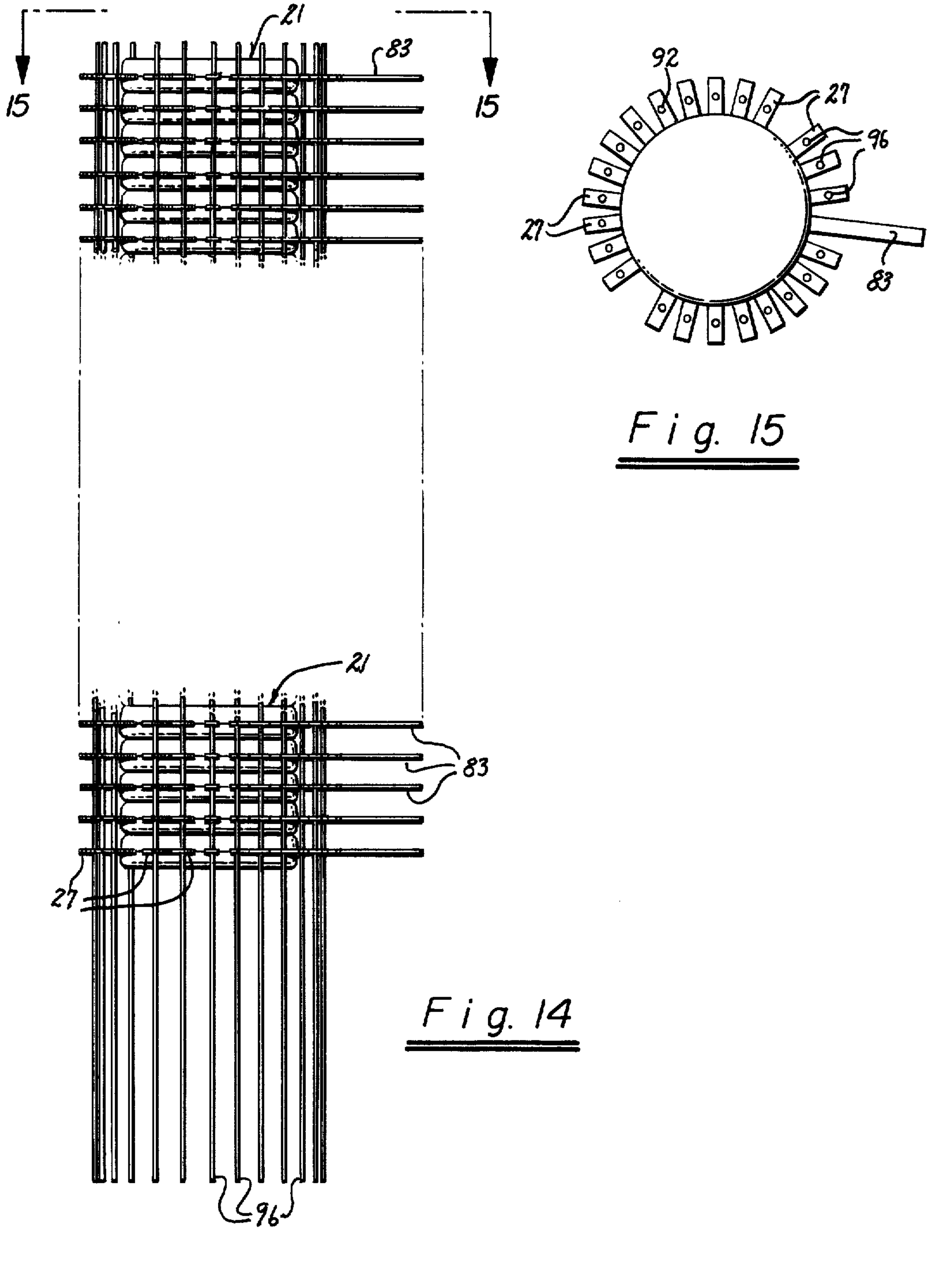
FIG. 14 is a side elevational view of still another embodiment of a semiconductor assembly incorporating the present invention also showing packages stacked one above the other and interconnected.
FIG. 15 is a top plan view looking along the line 15—15 of FIG. 14.

Still another embodiment of the same type of assembly is shown in FIGS. 14 and 15 which, however, has a simpler type construction. As shown in FIGS. 14 and 15, the pill-like packages 21 are again stacked one above the other with their leads 27 in vertical alignment and with the chip enable leads 43 also in vertical alignment. The leads 27 are interconnected by wires or conductors 96 which extend through the holes 92 provided in the leads 27. As in the previous embodiment, the conductors 96 can be coated with tin and after they have been inserted through all of the holes 92 in the leads 27, the assembly can be immersed in a suitable heated solution such as heated peanut oil to cause reflowing of the solder to cause good bonds to be formed between the conductors 96 and the leads 27. It has been found that this assembly in and of itself is sufficiently rigid to form a self-supporting structure which does not require the use of a supporting tube as in the previous embodiments. The assembly 27 in FIGS. 14 and 15 can be mounted upon a printed circuit board or it can be utilized in any manner desired. Again, it can be seen that large memories can be provided by an assembly which is relatively small.

From the foregoing, it can be seen that semiconductor assemblies have been provided which make it possible to readily mount pill-like packages so that they can be utilized directly in circuitry without the use of additional encapsulating means. Thus, they can be directly mounted on printed circuit boards and the like. Alternatively, they can be mounted in stacks and then secured to the printed circuit boards. The methods which are disclosed can be accomplished by hand or can be incorporated for use with automatic equipment.

I claim:

1. In a semiconductor assembly, mounting means and a package carried by the mounting means, said package comprising a semiconductor body having at least a portion of an electrical circuit formed therein with contact pads in a predetermined pattern carried by the body and lying in a common plane, a plurality of leads bonded to said contact pads, said leads extending outwardly from the semiconductor body and having outer extremities which lie exclusively in a single plane in a predetermined pattern, encapsulating means encapsulating said semiconductor body and the portions of said leads in engagement with said contact pads and so that the outer extremities of said leads are free of the encapsulating means and being readily accessible, said mounting means comprising a planar substrate having a planar surface, leads formed on said surface and having inner extremities forming at least one pattern corresponding to the pattern of the outer extremities of the leads of the package, said package being disposed so that it faces said planar surface of said substrate with the outer extremities of its leads overlying the inner extremities forming at least one pattern and means forming bonds between the outer extremities of the leads of the package and the inner extremities of the leads on said surface.

2. An assembly as in claim 1 wherein said substrate with leads thereon is in the form of a printed circuit board having leads adherent thereto.

3. A semiconductor assembly as in claim 1 wherein all of said leads of said package are bonded to said leads formed on said surface.

4. An assembly as in claim 1 wherein said encapsulating means forms a body of insulating material and wherein said leads of said package extend outwardly and downwardly from the body at an angle with respect to the body and at a distance below the lower surface of the body so that the leads can be sprung into engagement with the leads carried by the substrate.

5. An assembly as in claim 4 wherein the leads of said package have a dog-leg shape having a portion inclined outwardly and downwardly and having outwardly extending portions lying in a common plane spaced below the lower surface of the body.

6. In a semiconductor assembly, mounting means and a plurality of packages stacked one above the other carried by the mounting means, each of said packages comprising a semiconductor body having at least a portion of an electrical circuit formed therein with a plurality of contact pads in a predetermined pattern carried by the body and lying in a common plane, a plurality of leads bonded to said plurality of contact pads, said leads extending outwardly from the semiconductor body and having outer extremities which lie exclusively in a single plane in a predetermined pattern, encapsulating means encapsulating said semiconductor body and the portions of said leads in engagement with said contact pads so that the outer extremities of said leads are free of the encapsulating means and are accessible from all sides, said mounting means including means for retaining said plurality of packages in a unitary assembly said mounting means also including means for electrically interconnecting the leads of said packages stacked one above the other.

7. An assembly as in claim 6 wherein said means forming interconnections between said stacked packages includes a tube having slots formed therein with said leads extending into said slots and a connecting layer of metal adherent to the side walls forming said slots and bonded to said leads.

8. An assembly as in claim 6 wherein said means forming interconnections includes a tube formed with slots and wherein said leads of said packages extend into said slots and conductors extending longitudinally of said slots and making contact with said leads of said packages.

9. An assembly as in claim 7 together with terminals disposed in said slots.

10. An assembly as in claim 6 wherein said encapsulating means has a pill-like conformation and said leads of said package extend radially from said pill-like encapsulation.

11. An assembly as in claim 6 wherein said mounting means is in the form of a plurality of elongate conductors and wherein said elongate conductors are secured to the leads and are generally parallel to each other.

12. An assembly as in claim 11 wherein said leads are provided with holes and wherein said conductors extend through said holes and are bonded to said leads.

13. In a semiconductor assembly, a substrate and a package carried by the substrate, said package comprising a semiconductor body having at least a portion of an electrical circuit formed therein with contact pads in a predetermined pattern carried by the body and lying in a common plane, a plurality of first leads bonded to said contact pads, said first leads extending outwardly from the semiconductor body and having outer extremities which lie in a predetermined pattern in a single plane first encapsulating means encapsulating said semiconductor body and the portions of said first leads in engagement with said contact pads and so that the outer extremities of said first leads are free of the first encapsulating means and are readily accessible, said substrate comprising means forming a layer of insulating material providing a planar surface lying in a plane, a plurality of second leads carried by said substrate and being adherent to said planar surface, said second leads having inner extremities arranged in a pattern corresponding to the pattern of the outer extremities of said first leads of said package and means forming a bond between the outer extremities of the first leads and the inner extremities of said second leads to provide a unitary assembly with the package being disposed on the same side of said layer of insulating material as the second leads.

14. An assembly as in claim 13 wherein said substrate is in the form of a printed circuit board.

15. An assembly as in claim 13 wherein said substrate is in the form of a ceramic board.

16. An assembly as in claim 13 wherein said encapsulating means is pill-like in conformation and wherein said package has a spider-like configuration.

17. An assembly as in claim 16 wherein said first leads are bent downwardly so they extend below the pill-like encapsulating means and wherein the leads are also provided with portions which are bent so that they extend in a direction so that the outer extremities of the same lie in a common plane spaced below the lower surface of the pill-like encapsulating means.

18. In a semiconductor assembly, a plurality of packages, each of said packages comprising a semiconductor body having at least a portion of an electrical circuit formed therein with a plurality of contact pads in a predetermined pattern carried by the body and lying in a common plane, a plurality of first leads bonded to said plurality of contact pads, said first leads extending outwardly from the semiconductor body and having outer extremities which lie in a predetermined pattern, first encapsulating means encapsulating said semiconductor body and the portions of said first leads in engagement with said contact pads and so that the outer extremities of the first leads are free of the first encapsulating means and are readily accessible and means mounting said plurality of packages so that they are positioned one above the other, said means for mounting said packages including means for electrically interconnecting the corresponding leads of each of the packages.

19. An assembly as in claim 18 wherein said interconnecting means extends between the packages and interconnects predetermined corresponding leads of each of the packages.

20. An assembly as in claim 18 wherein said interconnecting means is in the form of a conducting channel carried by the mounting means and wherein said corresponding leads of said packages are disposed within said conducting channels and make electrical contact therewith.

21. An assembly as in claim 18 wherein said interconnecting means is in the form of an electrical conductor which is connected to each of the corresponding leads of said packages.

* * * * *